US010297611B1

(12) United States Patent
Wells et al.

(10) Patent No.: US 10,297,611 B1
(45) Date of Patent: May 21, 2019

(54) TRANSISTORS AND ARRAYS OF ELEVATIONALLY-EXTENDING STRINGS OF MEMORY CELLS

(71) Applicant: Micron Technology, Inc., Boise, ID (US)

(72) Inventors: David H. Wells, Boise, ID (US); Luan C. Tran, Meridian, ID (US); Jie Li, Boise, ID (US); Anish A. Khandekar, Boise, ID (US); Kunal Shrotri, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/903,307

(22) Filed: Feb. 23, 2018

Related U.S. Application Data

(60) Provisional application No. 62/610,847, filed on Dec. 27, 2017.

(51) Int. Cl.
  *H01L 27/11556* (2017.01)
  *H01L 27/11582* (2017.01)
  (Continued)

(52) U.S. Cl.
  CPC .. *H01L 27/11582* (2013.01); *H01L 27/11556* (2013.01); *H01L 29/0649* (2013.01);
  (Continued)

(58) Field of Classification Search
  CPC ............... H01L 29/7881; H01L 29/513; H01L 29/1033; H01L 29/518; H01L 29/78;
  (Continued)

(56) References Cited

U.S. PATENT DOCUMENTS 5,065,222 A   11/1991  Ishii
7,923,364 B2   4/2011  Goda
(Continued)

OTHER PUBLICATIONS

Kim, "Tunnel Oxide Nitridation Effect on the Evolution of Vt Instabilities (RTS/QED) and Defect Characterization for Sub-40-nm Flash Memory," IEEE Electron Device Letters, vol. 32 (8), Aug. 2011, pp. 999-1001.

(Continued)

*Primary Examiner* — Jarrett J Stark
(74) *Attorney, Agent, or Firm* — Wells St. John P.S.

(57) ABSTRACT

A transistor comprises channel material having first and second opposing sides. A gate is on the first side of the channel material and a gate insulator is between the gate and the channel material. A first insulating material has first and second opposing sides, with the first side being adjacent the second side of the channel material. A second insulating material of different composition from that of the first insulating material is adjacent the second side of the first insulating material. The second insulating material has at least one of (a), (b), and (c), where, (a): lower oxygen diffusivity than the first material, (b): net positive charge, and (c): at least two times greater shear strength than the first material. In some embodiments, an array of elevationally-extending strings of memory cells comprises such transistors. Other embodiments, including method, are disclosed.

32 Claims, 9 Drawing Sheets

(51) Int. Cl.
*H01L 29/51* (2006.01)
*H01L 29/10* (2006.01)
*H01L 29/06* (2006.01)
*H01L 29/788* (2006.01)
*H01L 29/792* (2006.01)
*H01L 29/78* (2006.01)
*H01L 21/02* (2006.01)

(52) U.S. Cl.
CPC ...... *H01L 29/1033* (2013.01); *H01L 29/1037* (2013.01); *H01L 29/513* (2013.01); *H01L 29/518* (2013.01); *H01L 29/78* (2013.01); *H01L 29/7881* (2013.01); *H01L 29/792* (2013.01); *H01L 21/02164* (2013.01); *H01L 21/02274* (2013.01); *H01L 21/02532* (2013.01); *H01L 21/02592* (2013.01); *H01L 21/02667* (2013.01)

(58) Field of Classification Search
CPC ............... H01L 29/792; H01L 29/0649; H01L 21/02667; H01L 21/02274; H01L 21/02532; H01L 21/02164; H01L 21/02592; H01L 27/11582; H01L 29/1037; H01L 27/11556
See application file for complete search history.

(56) References Cited

U.S. PATENT DOCUMENTS

| | | | |
|---|---|---|---|
| 9,070,481 | B1 | 6/2015 | Ellis |
| 9,478,558 | B2* | 10/2016 | Koka ................. H01L 27/11582 |
| 9,741,737 | B1* | 8/2017 | Huang ................. H01L 23/5226 |
| 9,985,098 | B2* | 5/2018 | Matsumoto ....... H01L 27/11524 |
| 2004/0087093 | A1 | 5/2004 | Fukuda et al. |
| 2007/0218663 | A1 | 9/2007 | Hao et al. |
| 2011/0210353 | A1 | 9/2011 | Ren |
| 2012/0286349 | A1 | 11/2012 | Tan |
| 2013/0270631 | A1* | 10/2013 | Kim .................... H01L 29/7827 257/331 |
| 2014/0175530 | A1* | 6/2014 | Chien ............... H01L 29/66825 257/321 |
| 2015/0056797 | A1 | 2/2015 | Kim et al. |
| 2015/0060998 | A1* | 3/2015 | Mizushima ......... H01L 29/7827 257/330 |
| 2016/0118396 | A1 | 4/2016 | Rabkin et al. |
| 2017/0012051 | A1 | 1/2017 | Lee et al. |
| 2018/0204849 | A1* | 7/2018 | Carlson ............. H01L 27/11582 |

OTHER PUBLICATIONS

Diffusion, Lecture Notes No. 9, MIT Open Course, pp. 1-16.
U.S. Appl. No. 15/645,202, filed Jul. 10, 2017, by Carlson et al.
U.S. Appl. No. 15/903,280, filed Feb. 23, 2018, by Wells et al.

* cited by examiner

TRANSISTORS AND ARRAYS OF ELEVATIONALLY-EXTENDING STRINGS OF MEMORY CELLS

TECHNICAL FIELD

Embodiments disclosed herein pertain to transistors, to arrays of elevationally-extending strings of memory cells, to methods of forming a channel region of a transistor, and to methods used in forming a memory array.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates, and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor.

Transistors may be used in circuitry other than memory circuitry.

DETAILED DESCRIPTION OF EXAMPLE EMBODIMENTS

Figure 1:
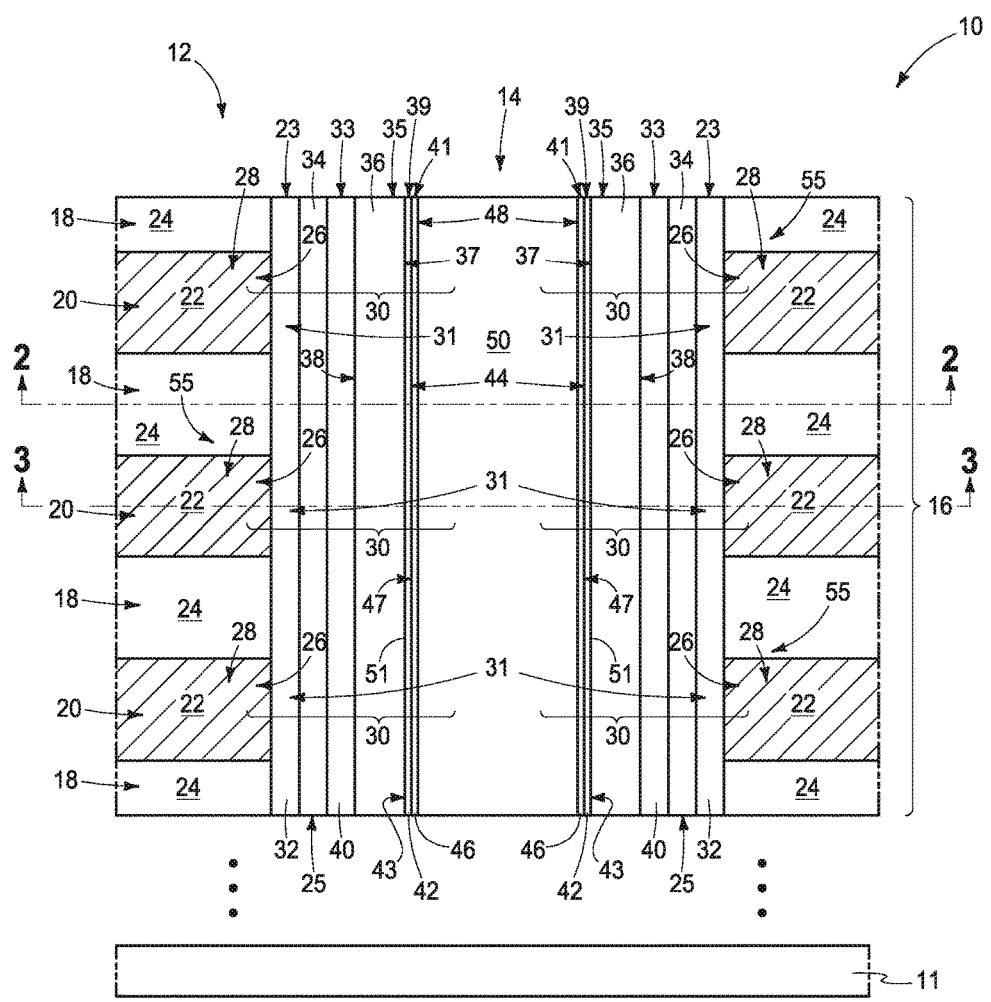
FIG. 1 is a diagrammatic cross-sectional view of a portion of an array of elevationally-extending strings of memory cells in accordance with an embodiment of the invention.

Embodiments of the invention encompass non-volatile transistors, semi-volatile transistors, and volatile transistors (e.g., volatile transistors that are devoid of any charge-storage material). Embodiments of the invention also encompass arrays of elevationally-extending strings of memory cells, for example strings of NAND memory cells. Embodiments of the invention also encompass methods of forming a channel region of a transistor and methods used in forming a memory array.

First example embodiments of an array of elevationally-extending strings of memory cells, also of individual transistors, are described with reference to FIGS. 1-3. A construction 10 comprises a base substrate 11 that may include any one or more of conductive/conductor/conducting (i.e., electrically herein), semiconductive/semiconductor/semi-conducting, or insulative/insulator/insulating (i.e., electrically herein) materials. Various materials have been formed elevationally over base substrate 11. Materials may be aside, elevationally inward, or elevationally outward of the FIGS. 1-3-depicted materials. For example, other partially or wholly fabricated components of integrated circuitry may be provided somewhere above, about, or within base substrate 11. Control and/or other peripheral circuitry for operating components within an array of transistors may also be fabricated, and may or may not be wholly or partially within a transistor array or sub-array. Further, multiple sub-arrays may also be fabricated and operated independently, in tandem, or otherwise relative one another. In this document, a "sub-array" may also be considered as an array.

Construction 10 comprises an array 12 of elevationally-extending strings 14 of memory cells 30. Only a single string 14 is shown, with likely, hundreds, thousands, tens of thousands, etc. of such strings being included in array 12.

Array 12 comprises a vertical stack 16 of alternating insulative tiers 18 and wordline tiers 20. Example tiers 20 comprise conductive material 22. Examples include elemental metals (e.g., tungsten, titanium, copper, etc.), metal material (e.g., metal nitrides, metal silicides, metal carbides, etc.), and conductively-doped-semiconductive materials (e.g., silicon, gallium, etc.), including mixtures thereof. Example tiers 18 comprise insulative material 24 (e.g., doped or undoped silicon dioxide). Array 12 is shown as having seven vertically-alternating tiers 18, 20 in FIG. 1 although fewer or likely many more (e.g., dozens, hundreds, etc.) may be formed. Accordingly, more tiers 18 and 20 may be above and/or below the depicted tiers. Tiers 18 and 20 may be of any suitable vertical thickness(es) and may have the same or different vertical thickness(es) relative one another. As an example, tiers 18 and 20 may have respective thicknesses of about 10 nanometers (nm) to 300 nm.

Wordline tiers 20 have terminal ends 26 in the depicted FIG. 1 cross-section that correspond to control-gate regions 28 of individual memory cells 30. Approximate locations of memory cells 30 are indicated with brackets in FIG. 1 and with a dashed outline in FIG. 3, with memory cells 30 being essentially ring-like or annular in the depicted example. Control-gate regions 28 may be part of individual control-gate lines 29 (only one being shown and numerically designated in FIG. 3) that interconnect multiple memory cells 30 of multiple strings 14 within individual wordline tiers 20 in a row direction. Dielectric material 27 (FIG. 3; e.g., silicon dioxide and/or silicon nitride) is laterally between control-gate lines 29. Alternate existing or yet-to-be-developed constructions may be used. For example, multiple memory cells (not shown) may be formed about a single string 14 in an individual wordline tier 20, for example by bifurcating the FIG. 3-depicted control-gate line 29 longitudinally down its middle (not shown) thus creating two memory cells (not shown) that may be separately controlled if such bifurcated control-gate lines are separately controllable.

Individual memory cells 30 have a charge-blocking region 31 that extends elevationally along individual control-gate regions 28 and charge-storage material 34 that extends elevationally along individual charge-blocking regions 31. A charge block may have the following functions in a memory cell: In a program mode, the charge block may prevent charge carriers from passing out of the charge-storage material (e.g., floating-gate material, charge-trapping material, etc.) toward the control gate, and in an erase mode the charge block may prevent charge carriers from flowing into the charge-storage material from the control gate. Accordingly, a charge block may function to block charge migration between the control-gate region and the charge-storage material of individual memory cells. An example charge-blocking region as shown comprises insulator material 32 (e.g., silicon dioxide and/or one or more high k materials, having an example thickness of 25 to 80 Angstroms). By way of further examples, a charge-blocking region may comprise a laterally (e.g., radially) outer portion of the charge-storage material (e.g., material 34) where such charge-storage material is insulative (e.g., in the absence of any different-composition material between an insulative-charge-storage material 34 and conductive material 22). Regardless, as an additional example, an interface of a charge-storage material and conductive material of a control gate may be sufficient to function as a charge-blocking region in the absence of any separate-composition-insulator material 32. Further, an interface of conductive material 22 with material 32 (when present) in combination with insulator material 32 may together function as a charge-blocking region, and as alternately or additionally may a laterally-outer region of an insulative-charge-storage material (e.g., a silicon nitride material 34).

Regardless, and in one embodiment, charge-blocking region 31 is formed from insulator material 32 that extends elevationally along stack 16 and in the form of a tube 23. In one embodiment, charge-storage material 34 extends elevationally along stack 16 and in the form of a tube 25. Charge-storage material 34 may comprise any suitable composition(s) and, in some embodiments, may comprise floating gate material (e.g., doped or undoped silicon) or charge-trapping material (e.g., silicon nitride, metal dots, etc.). In some embodiments, charge-storage material 34 may comprise, consist essentially of, or consist of silicon nitride. An example thickness is 50 to 80 Angstroms.

Individual memory cells 30 comprise channel material 36 (ideally crystalline) that also extends elevationally along stack 16. In one embodiment channel material 36 so-extends in the form of a tube 35. Channel material 36 has a laterally-inner side 37 (e.g., a radially-inner side) and a laterally-outer side 38 (e.g. a radially-outer side). In some embodiments, sides 38 and 37 are referred to as first and second opposing sides 38 and 37, respectively. Example channel materials 36 include undoped or appropriately-doped crystalline semiconductor material, such as one or more of silicon, germanium and so-called III/V semiconductor materials (e.g., GaAs, InP, GaP and GaN).

Charge-passage material 40 (e.g., a gate insulator) is laterally (e.g., radially) between channel material 36 and charge-storage material 34. In one embodiment, charge-passage material 40 extends elevationally along stack 16 and in the form of a tube 33. Charge-passage material 40 may be, by way of example, a bandgap-engineered structure having nitrogen-containing material (e.g., silicon nitride) sandwiched between two insulator oxides (e.g., silicon dioxide). An example thickness is 25 to 80 Angstroms.

Construction 10 comprises a first insulating material 42 having first and second opposing sides 43 and 44, respectively. In one embodiment, first insulating material 42 extends elevationally along stack 16 and in the form of a tube 39. First side 43 is adjacent laterally-inner side 37 (i.e., more so than is second side 44) of channel material 36. Construction 10 comprises a second insulating material 46 of different composition from that of first insulating material 42 and has first and second opposing sides 47 and 48, respectively. In one embodiment, second insulating material 46 extends elevationally along stack 16 and in the form of a tube 41. Second insulating material 46 is adjacent second side 44 of first insulating material 42. Example memory cell string 14 is shown as comprising a radially-central solid dielectric material 50 (e.g., spin-on-dielectric, silicon dioxide, and/or silicon nitride). Alternately, and by way of example only, the radially-central portion of memory cell string 14 may include void space(s) (not shown) or be devoid of solid material (not shown).

In one embodiment, first insulating material 42 comprises, consists essentially of, or consists of at least one of $Si_xO_y$ (x and y each greater than 0), $Si_xO_yN_z$ (x, y, and z each greater than 0), $Al_3O_4$, $ZrO_2$, $HfO_2$, $Pr_2O_3$, and $Ta_2O_5$, and second insulating material 46 comprises, consists essentially of, or consists of at least one of $Si_3N_4$, $Al_2O_3$, HfN, $HfO_xN_y$ (x and y each greater than 0), $HfY_xO_y$ (x and y each greater than 0), BN, AlN, SiC, diamond, diamond-like carbon, $Si_xN_yH_z$ (x, y, and z each greater than 0), $Hf_xN_yH_z$ (x, y, and z each greater than 0), $HfO_xN_yH_z$ (x, y, and z each greater than 0), $HfY_xO_yH_z$ (x, y, and z each greater than 0), $BN_xH_y$ (x, y, and z each greater than 0), and $AlN_xH_y$ (x and y each greater than 0). In one embodiment and as shown, first side 43 of first insulating material 42 is directly against laterally-inner side 37 of channel material 36, and the at least one of $Si_xO_y$, $Si_xO_yN_z$, $Al_3O_4$, $ZrO_2$, $HfO_2$, $Pr_2O_3$, and $Ta_2O_5$ is directly against laterally-inner side 37 of channel material 36. In one embodiment and as shown, second insulating material 46 is directly against second side 44 of first insulating material 42, and the at least one of $Si_3N_4$, $Al_2O_3$, HfN, $HfO_xN_y$, $HfY_xO_y$, BN, AlN, SiC, diamond, diamond-like carbon, $Si_xN_yH_z$, $Hf_xN_yH_z$, $HfO_xN_yH_z$, $HfY_xO_yH_z$, $BN_xH_y$, and $AlN_xH_y$ is directly against the at least one of $Si_xO_y$, $Si_xO_yN_z$, $Al_3O_4$, $ZrO_2$, $HfO_2$, $Pr_2O_3$, and $Ta_2O_5$ of first material 42. In one embodiment, first insulating material 42 comprises more than one of $Si_xO_y$, $Si_xO_yN_z$, $Al_3O_4$, $ZrO_2$, $HfO_2$, $Pr_2O_3$, and $Ta_2O_5$. In one embodiment, second insulating material 46 comprises more than one of $Si_3N_4$, $Al_2O_3$, HfN, $HfO_xN_y$, $HfY_xO_y$, BN, AlN, SiC, diamond, diamond-like carbon, $Si_xN_yH_z$, $Hf_xN_yH_z$, $HfO_xN_yH_z$, $HfY_xO_yH_z$, $BN_xH_y$, and $AlN_xH_y$. Any other attribute(s) or aspect(s) as shown and/or described herein with respect to other embodiments may be used.

Materials/regions 28, 31, 34, 40, 36, 42, and 46 constitute an example embodiment of a transistor 55 in accordance with an embodiment of the invention, and which in such embodiment is a non-volatile programmable transistor comprising charge-storage material.

In one embodiment, and independent of whether comprising any of the above specifically-stated composition materials for materials 42 and 46, second insulating material 46 has at least one of (a), (b), and (c), where, (a) is lower oxygen diffusivity than first material 42, (b) is net positive charge (i.e., total or overall charge that is positive even though negative charges may also be present, and also known as fixed positive charge density), and (c) is at least two times greater shear strength than first material 42. In one embodiment, second insulating material 46 has (a): lower oxygen diffusivity than first material 42, in one such embodiment oxygen diffusivity of no more than $5 \times 10^{-11}/cm^2$ at 600° C., in one such embodiment at least two times lower oxygen diffusivity than first material 42, and in one such embodiment at least ten times lower oxygen diffusivity than first material 42. In one embodiment, second insulating material 46 has (b): net positive charge, with in one such embodiment having net positive charge of at least $5.0 \times 10^{12}/cm^2$. In one embodiment, second insulating material 46 has (c): at least two times greater sheer strength than first material 42, in one such embodiment shear strength of at least 200 GPA, and in one such embodiment at least four times greater sheer strength than first material 42. As examples, shear strengths of some possible second insulator materials 46 are $Si_3N_4$: 250 to 310 GPa, $Al_2O_3$: 400 GPa, BN: 440 GPa, AlN: 350 GPa, SiC: 480 GPa, diamond: 1050 GPa, and diamond-like carbon: 200 GPa. Example $SiO_2$ first material has typical shear strength of 50 to 80 GPa.

In one embodiment, second insulating material 46 has only one of (a), (b), and (c). In one embodiment, second insulating material 46 has only two of (a), (b), and (c). In one embodiment, second insulating material 46 has all three of (a), (b), and (c). In one embodiment, channel material 36 comprises crystalline silicon, first insulating material 42 comprises $Si_xO_y$ (x and y each greater than 0), and second insulating material 46 comprises $Si_3N_4$. Any other attribute(s) or aspect(s) as shown and/or described herein with respect to other embodiments may be used.

Figure 4:
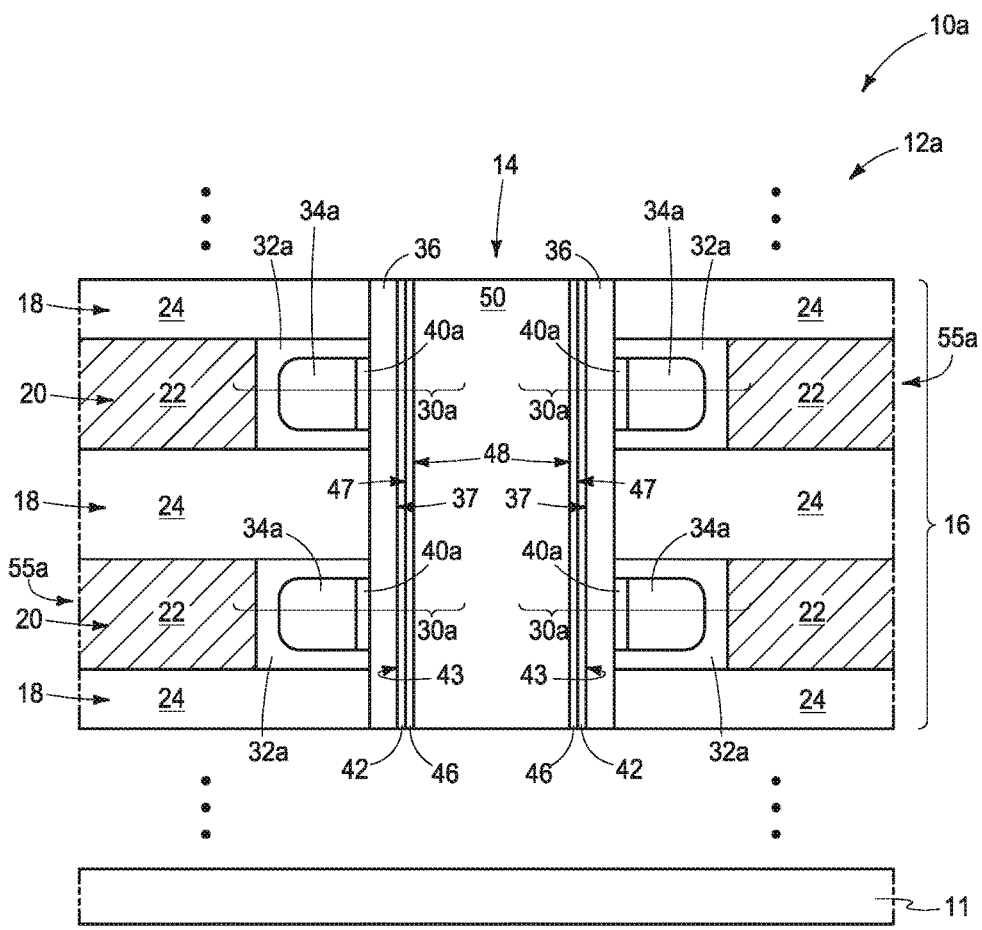
FIG. 4 is a diagrammatic cross-sectional view of a portion of an array of elevationally-extending strings of memory cells in accordance with an embodiment of the invention.

FIG. 4 shows a construction 10a illustrating another example embodiment memory array 12a. Like numerals from the above-described embodiments have been used where appropriate, with some construction differences being indicated with the suffix "a". Example memory cells 30a individually comprise a transistor 55a. Example charge-blocking material 32a, charge-storage material 34a, and gate insulator material 40a do not extend all along vertical stack 16 in construction 10a. Charge-blocking material 32a partially surrounds charge-storage material 34a. Any other attribute(s) or aspect(s) as shown and/or described herein with respect to other embodiments may be used.

Figure 5:
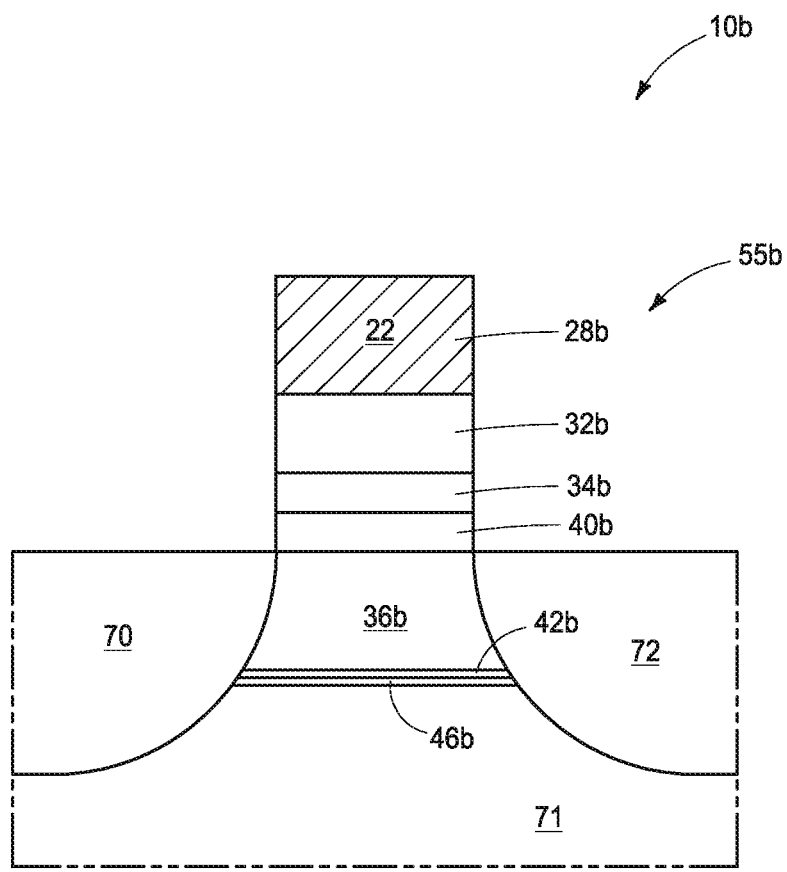
FIG. 5 is a diagrammatic cross-sectional view of a transistor in accordance with an embodiment of the invention.

Transistors 55 and 55a are example elevationally-extending transistors, and which in one embodiment are shown to be vertical or within 10° of vertical. As an alternate example, a transistor may be other than elevationally-extending, for example being a horizontal transistor 55b of construction 10b as shown in FIG. 5. Like numerals from the above-described embodiments have been used where appropriate, with some construction differences being indicated with the suffix "b" or with different numerals. Transistor 55b includes control gate 28b, charge-blocking region 32b, charge-storage material 34b, and insulative-charge passage material 40b. A pair of source/drain regions 70 and 72 are within a semiconductor base material 71. A channel region 36b is within semiconductor base material 71 and between source/drain regions 70 and 72, with channel region 36b being under charge-passage material 40b. First and second insulating materials 42b and 46b are provided as shown. Semiconductor material 71 is shown as bulk material, although alternate constructions may be used (e.g., semiconductor-on-insulator). Any other attribute(s) or aspect(s) as shown and/or described herein with respect to other embodiments may be used.

Figure 6:
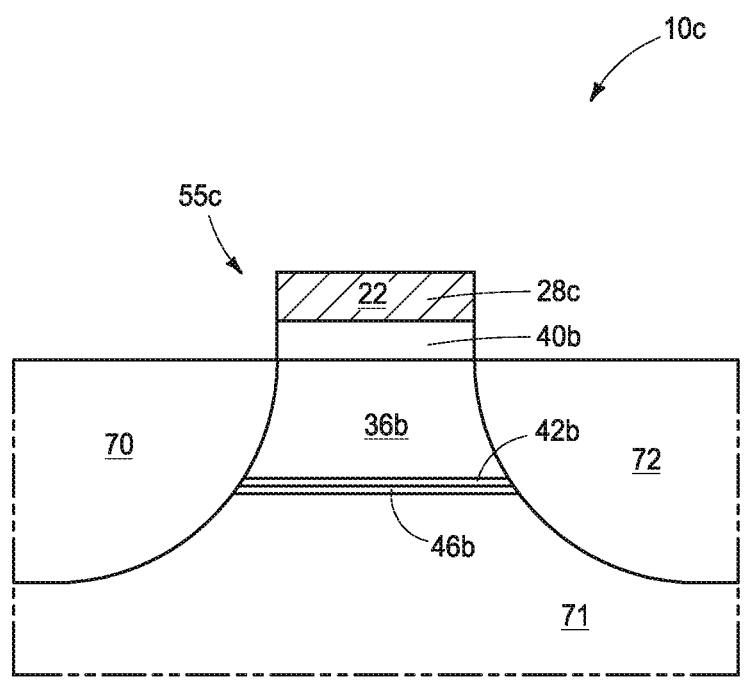
FIG. 6 is a diagrammatic cross-sectional view of a transistor in accordance with an embodiment of the invention.

Each example transistors 55, 55a, and 55b as shown and described individually comprise a non-volatile programmable transistor, for example comprising a control gate, a charge-blocking region adjacent the control gate, charge-storage material adjacent the charge-blocking region; and gate insulator between the channel material and the charge-storage material. Embodiments of the invention also encompass a volatile transistor, for example one being devoid of any charge-storage material, and including an array of such transistors. As an example, FIG. 6 shows an alternate embodiment horizontal transistor 55c of a construction 10c. Like numerals from the above-described embodiments have been used where appropriate, with some construction differences being indicated with the suffix "c". Transistor 55c comprises a gate 28c (e.g., as part of an access line [not separately shown] interconnecting multiple transistors [not shown] in a row direction [not shown]), and is shown as being devoid of any charge-storage material of the FIGS. 1-5-constructions. Transistor 55c may of course be other than horizontally-oriented (not shown). Any other attribute(s) or aspect(s) as shown and/or described herein with respect to other embodiments may be used.

An embodiment of the invention comprises a method used in forming a memory array, for example, a memory array as shown in the embodiments of any of FIGS. 1-4. Example such methods are described with reference to FIGS. 7-9 to result in the example finished construction of FIGS. 1-3. Like numerals from the above-described embodiments have been used for predecessor construction(s), regions, and like/predecessor materials thereof. Any attribute(s) or aspect(s) as shown and/or described herein with respect to structure embodiments may be used in the method embodiments. Likewise, any attribute(s) or aspect(s) as shown and/or described herein with respect to method embodiments may be used in the structure embodiments.

Figure 7:
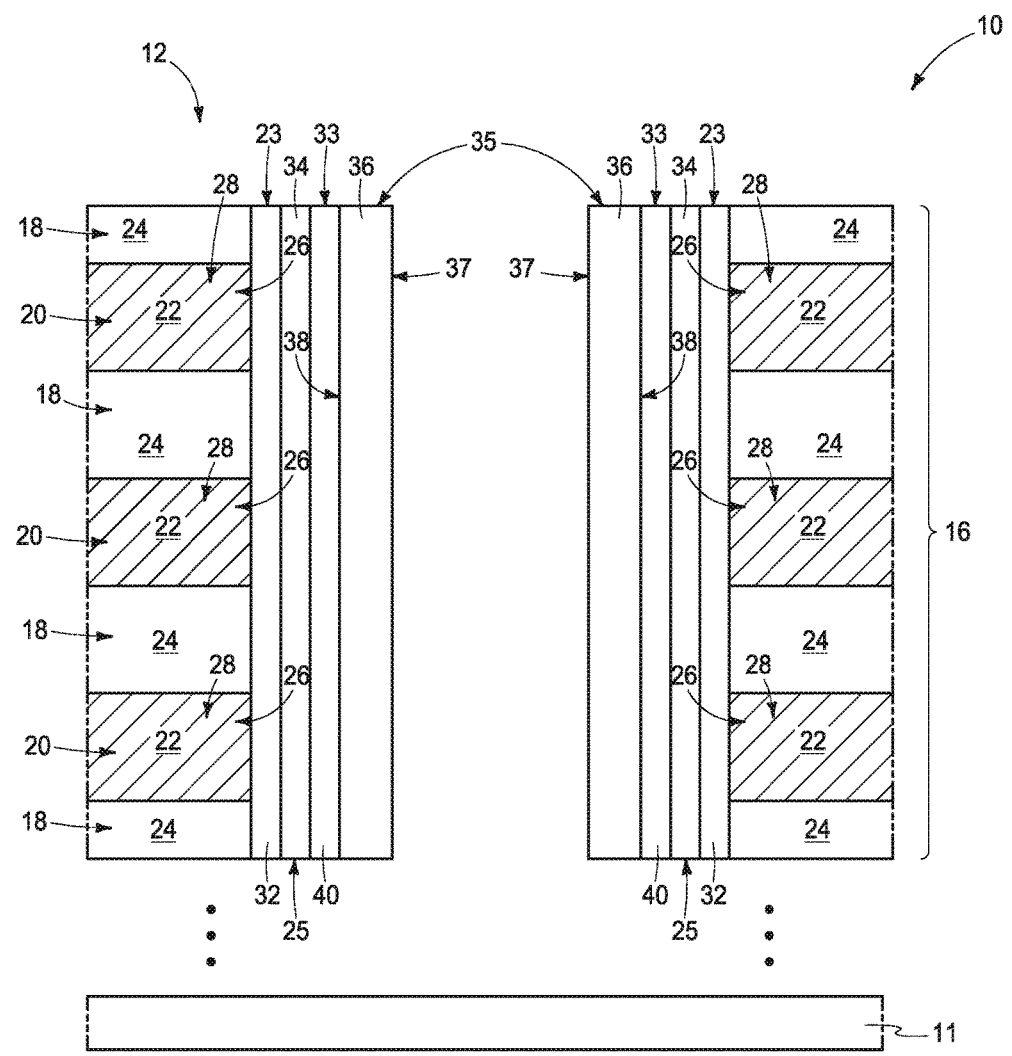
FIG. 7 is a diagrammatic cross-sectional view of a substrate construction in process in accordance with an embodiment of the invention.

Referring to FIG. 7, such shows a predecessor construction to that of FIG. 1 comprising an assembly or construction 10 comprising vertical stack 16 comprising alternating tiers 18 and 20 of different composition materials. One of the different composition materials (i.e., at least one) and corresponding of the alternating tiers (e.g., 18) is insulative, for example comprising insulative material 24. Processing, by way of example, may be conducted by so-called "gate-first" or "gate-last" processing. Regardless, assembly/construction 10 comprises at least conductive control-gate material 22 and a hollow tube 35 of amorphous channel material 36 extending elevationally through stack 16. Example channel materials include any of those described above, with such channel material being amorphous at this point in the depicted and described process.

Figure 8:
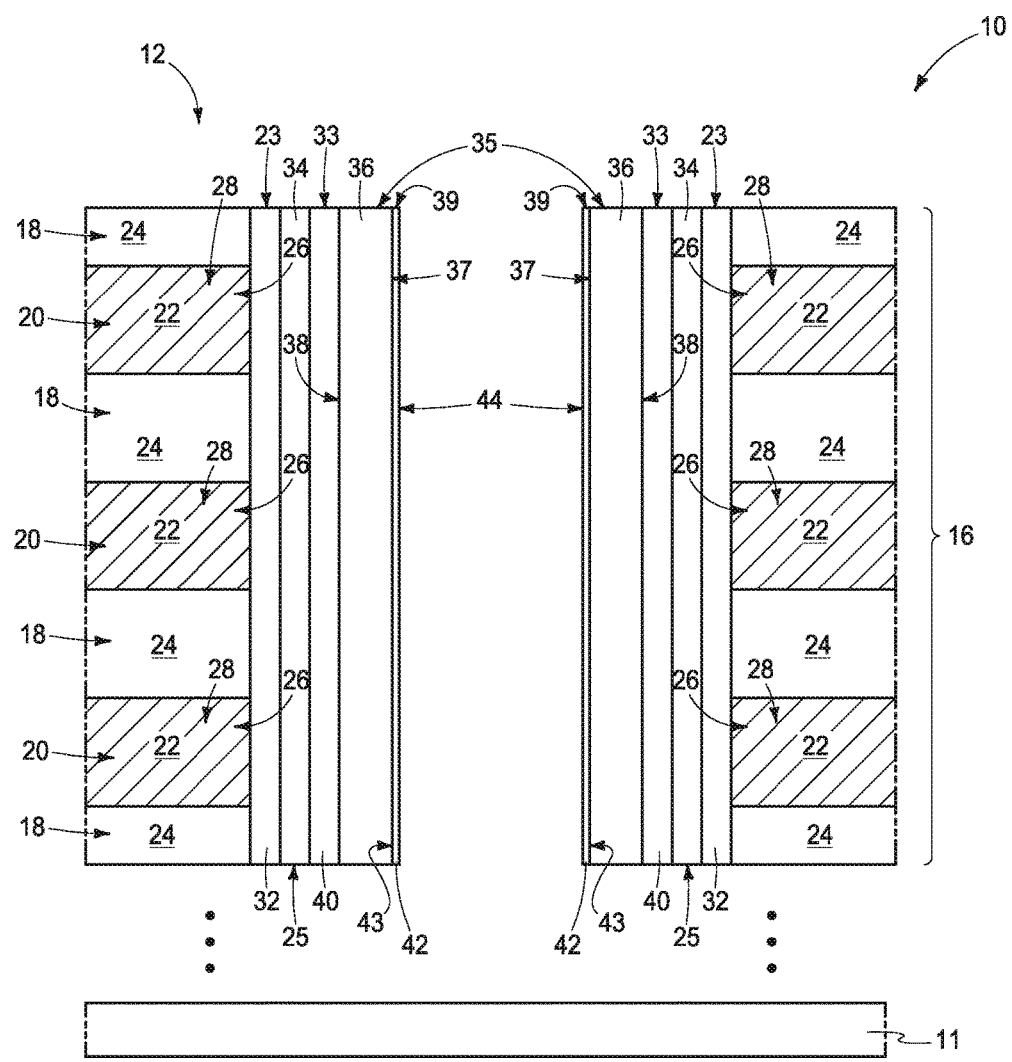
FIG. 8 is a view of the FIG. 7 construction at a processing step subsequent to that shown by FIG. 7.

Referring to FIG. 8, hollow tube 39 of insulator material 42 has been formed adjacent a radially-inner side (e.g., side 37) of hollow tube 35 of amorphous channel material 36 at a temperature below a crystallization temperature at and above which amorphous channel material 36 would become crystalline. In this document, "amorphous" requires at least 90% by volume amorphous phase and "crystalline" requires at least 90% by volume crystalline phase (i.e. meaning at least 90% by volume total crystallinity regardless whether of one or of multiple crystalline phases). Different semiconductor channel materials have different crystallization temperatures at and above which such transitions/transforms from being amorphous to being crystalline. Such may, in part, depend upon type and/or quantity of conductivity-modifying dopant within the channel material. For example, and by way of example only, amorphous elemental silicon has a crystallization temperature of about 570° C. which can drop to around 530° C. depending upon type and quantity of dopant provided therein. Insulator material 42 may be deposited by any suitable existing or yet-to-be-developed manners. One example is PECVD in an inductively-coupled plasma reactor at pressure of from 5 mTorr to 10 mTorr, chuck temperature of at least 175° C., and flow rate of suitable precursor(s) of 40 to 3000 sccm.

Regardless, amorphous channel material 36 having insulator material 42 there-adjacent is subjected to a temperature at or above the crystallization temperature to transform the amorphous channel material into crystalline channel material. In accordance with method embodiments, such may or may not occur in presence or absence of any of second insulating material 46 (not shown in FIG. 8). However, in one embodiment, an insulating material (e.g., second insulating material 46) is formed directly against side 37 of amorphous channel material 36. Regardless, in one embodiment, the amorphous channel material comprises elemental-form silicon and the first insulating material comprises $SiO_2$, with an interface of the elemental-form silicon and the $SiO_2$ having density of interface traps of $10^9$ to $10^{13}$ traps/cm$^2$ per eV, in one embodiment $10^9$ to $10^{11}$ traps/cm$^2$ per eV, before and after crystallization.

Figure 9:
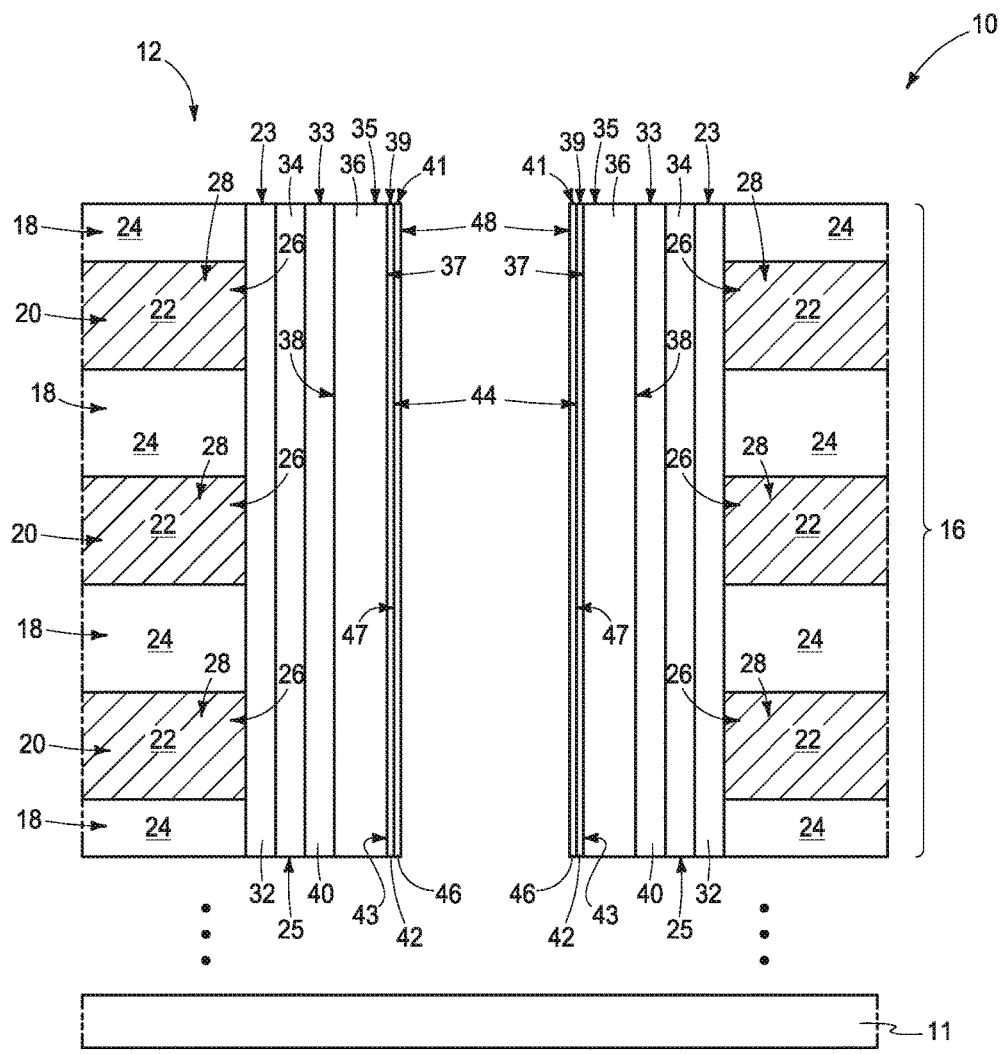
FIG. 9 is a view of the FIG. 8 construction at a processing step subsequent to that shown by FIG. 8.

Referring to FIG. 9, and in one embodiment, hollow tube 41 of second insulating material 46 has been formed adjacent radially-inner side 44 of hollow tube 39 of insulator/first insulating material 42. In one embodiment, all of second insulating material 46 is formed before transforming of amorphous channel material 36 into crystalline channel material 36. In an alternate embodiment, all of second insulating material 46 is formed after transforming of amorphous channel material 36 into crystalline channel material 36. In another alternate embodiment, at least some of second insulating material 46 is formed during the transforming of amorphous channel material 36 into crystalline channel material 36. Subsequent processing may occur, for example to fill the center of the structure with solid dielectric material 50 as shown in FIG. 1.

Figure 2:
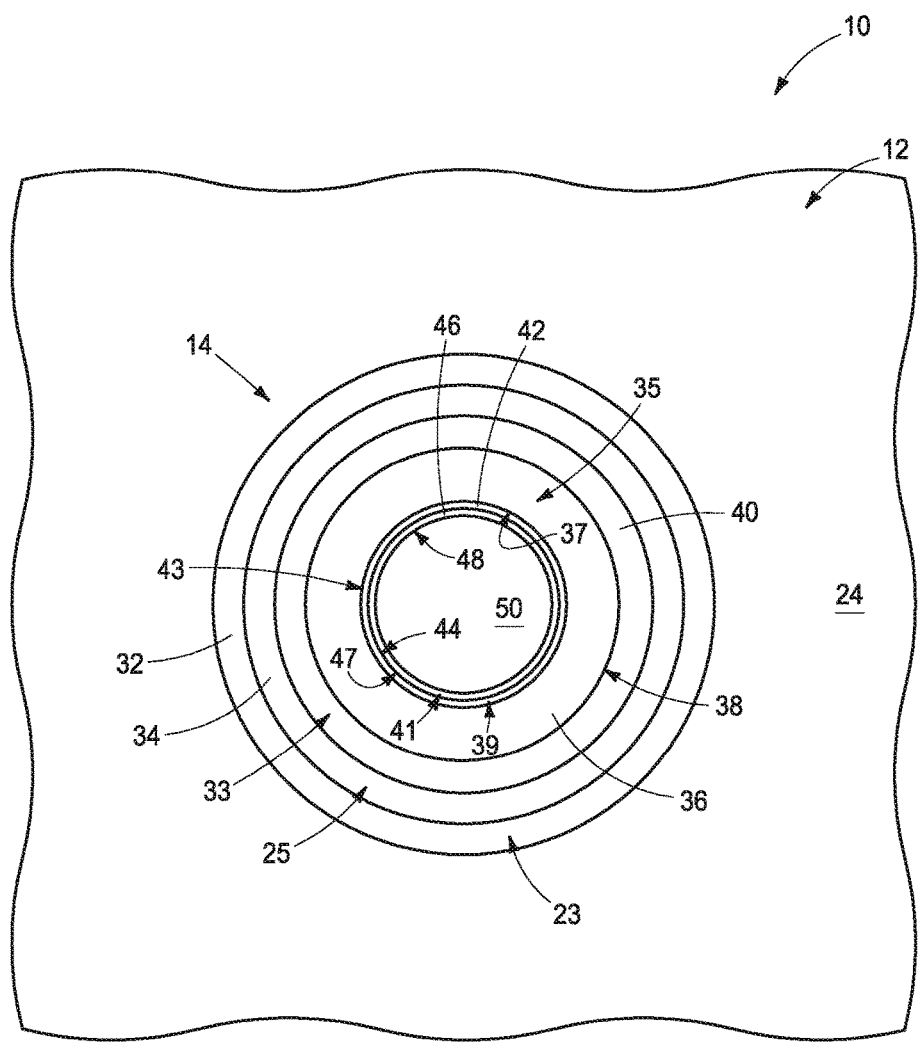
FIG. 2 is a cross-sectional view taken through line 2-2 in FIG. 1.
Figure 3:
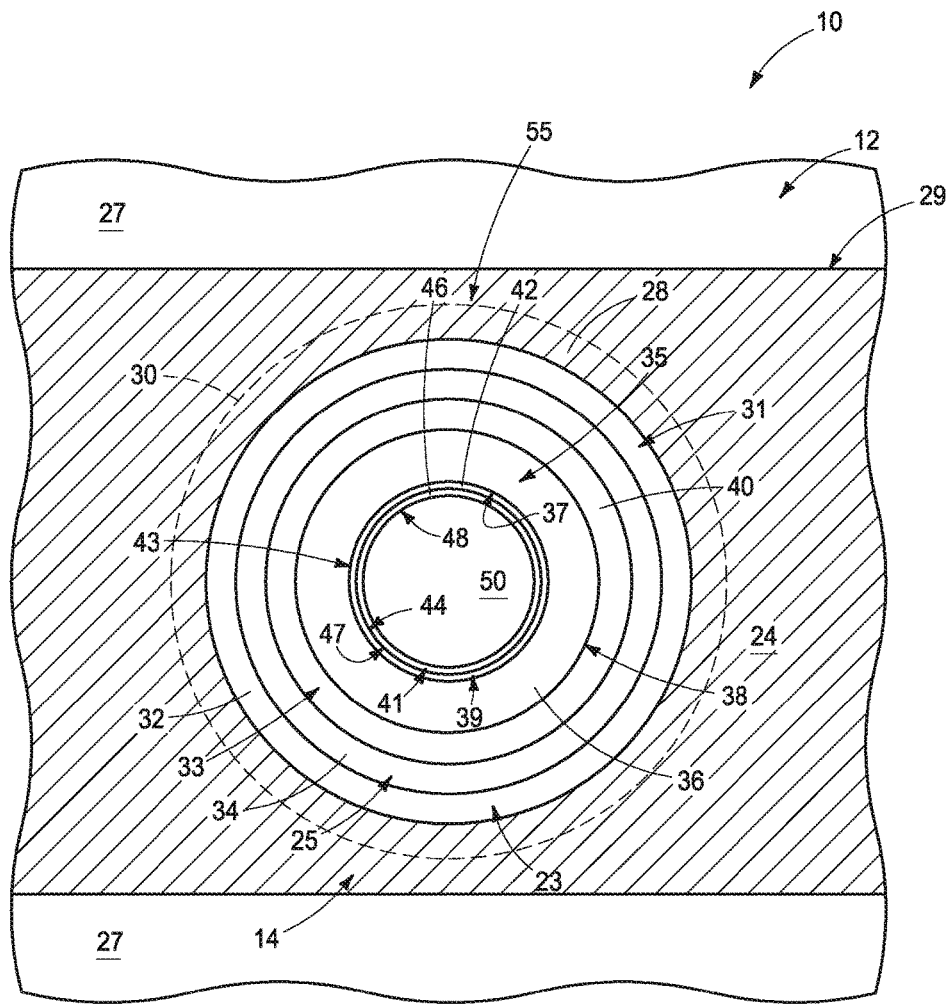
FIG. 3 is a cross-sectional view taken through line 3-3 in FIG. 1.

Methods in accordance with the invention may be used to form structures other than that shown in FIGS. 1-3, including and not limited to horizontal structures. For example, the methods as just-described may be used in forming a channel region of a transistor whether that transistor be elevationally-extending, horizontal, or of other orientation.

In one embodiment, amorphous channel material is formed over a substrate, with the amorphous channel material having first and second opposing sides. An insulator material is formed adjacent the second side of the amorphous channel material (e.g., comprising ion implantation if the second side is not exposed and by deposition if the second side is exposed) below a crystallization temperature at and above which the amorphous channel material would become crystalline. The amorphous channel material having the insulator material there-adjacent is subjected to a temperature at or above the crystallization temperature to transform the amorphous channel material into crystalline channel material. Any other attribute(s) or aspect(s) as shown and/or described herein with respect to other embodiments may be used.

In one embodiment, a first insulating material is formed adjacent the second side of the amorphous channel material below a crystallization temperature at and above which the amorphous channel material would become crystalline. The first insulating material has first and second opposing sides. The first side of the first insulating material is adjacent the second side of the amorphous channel material. A second channel material of different composition from that of the first channel material is formed adjacent the second side of the first insulating material. The amorphous channel material having the first insulating material there-adjacent is subjected to a temperature at or above the crystallization temperature to transform the amorphous channel material into crystalline channel material. Any other attribute(s) or aspect(s) as shown and/or described herein with respect to other embodiments may be used.

Method embodiments of the invention may result in any one or more of improved string current in elevationally-extending strings of memory cells, improved channel tunneling in programmable charge-storage transistors, passivation of the backside of amorphous channel material before crystallization thereof, and reduced density of interface traps of the backside of the channel with an insulator material directly there-against.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally" and "elevationally-extending" with respect to a field effect transistor are with reference to orientation of the transistor's channel length along which current flows in operation between the source/drain regions. For bipolar junction transistors, "extend(ing) elevationally" and "elevationally-extending" are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/material s/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

CONCLUSION

In some embodiments, a transistor comprises channel material having first and second opposing sides. A gate is on the first side of the channel material and a gate insulator is between the gate and the channel material. A first insulating material has first and second opposing sides, with the first side being adjacent the second side of the channel material. A second insulating material of different composition from that of the first insulating material is adjacent the second side of the first insulating material. The second insulating material has at least one of (a), (b), and (c), where, (a): lower oxygen diffusivity than the first material, (b): net positive charge, and (c): at least two times greater shear strength than the first material. In some embodiments, an array of elevationally-extending strings of memory cells comprises such transistors.

In some embodiments, a transistor comprises channel material having first and second opposing sides. A gate is on the first side of the channel material and a gate insulator is between the gate and the channel material. A first insulating material has first and second opposing sides, with the first side being adjacent the second side of the channel material. The first insulating material comprises at least one of $Si_xO_y$ (x and y each greater than 0), $Si_xO_yN_z$ (x, y, and z each greater than 0), $Al_3O_4$, $ZrO_2$, $HfO_2$, $Pr_2O_3$, and $Ta_2O_5$. A second insulating material of different composition from that of the first insulating material is adjacent the second side of the first insulating material. The second insulating material comprises at least one of $Si_3N_4$, $Al_2O_3$, HfN, $HfO_xN_y$ (x and y each greater than 0), $HfY_xO_y$ (x and y each greater than 0), BN, AlN, SiC, diamond, diamond-like carbon, $Si_xN_yH_z$ (x, y, and z each greater than 0), $Hf_xN_yH_z$ (x, y, and z each greater than 0), $HfO_xN_yH_z$ (x, y, and z each greater than 0), $HfY_xO_yH_z$ (x, y, and z each greater than 0), $BN_xH_y$ (x and y each greater than 0), and $AlN_xH_y$ (x and y each greater than 0). In some embodiments, an array of elevationally-extending strings of memory cells comprises such transistors.

In some embodiments, a method of forming a channel region of a transistor, comprises forming amorphous channel material over a substrate. The amorphous channel material has first and second opposing sides. An insulator material is formed adjacent the second side of the amorphous channel material below a crystallization temperature at and above which the amorphous channel material would become crystalline. The amorphous channel material having the insulator material there-adjacent is subjected to a temperature at or above the crystallization temperature to transform the amorphous channel material into crystalline channel material.

In some embodiments, a method of forming a channel region of a transistor, comprises forming amorphous channel material over a substrate. The amorphous channel material has first and second opposing sides. A first insulating material is formed adjacent the second side of the amorphous channel material below a crystallization temperature at and above which the amorphous channel material would become crystalline. The first insulating material has first and second opposing sides. The first side of the first insulating material is adjacent the second side of the amorphous channel material. A second insulating material of different composition from that of the first insulating material is formed adjacent the second side of the first insulating material. The amorphous channel material having the first insulating material there-adjacent is subjected to a temperature at or above the crystallization temperature to transform the amorphous channel material into crystalline channel material.

In some embodiments, a method used in forming a memory array comprises forming an assembly comprising a vertical stack comprising alternating tiers of different composition materials. One of the different composition materials and corresponding of the alternating tiers are insulative. The assembly comprises a hollow tube of amorphous channel material extending elevationally through the stack. A hollow tube of insulator material is formed adjacent a radially-inner side of the hollow tube of the amorphous channel material below a crystallization temperature at and above which the amorphous channel material would become crystalline. The amorphous channel material having the insulator material there-adjacent is subjected to a temperature at or above the crystallization temperature to transform the amorphous channel material into crystalline channel material.

In some embodiments, a method used in forming a memory array comprises forming an assembly comprising a vertical stack comprising alternating tiers of different composition materials. One of the different composition materials and corresponding of the alternating tiers is insulative. The assembly comprises a hollow tube of amorphous channel material extending elevationally through the stack. A hollow tube of first insulating material is formed adjacent a radially-inner side of the hollow tube of the amorphous channel material below a crystallization temperature at and above which the amorphous channel material would become crystalline. A hollow tube of second insulating material is formed adjacent a radially-inner side of the hollow tube of the first insulating material. The amorphous channel material having the first insulating material there-adjacent is subjected to a temperature at or above the crystallization temperature to transform the amorphous channel material into crystalline channel material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An array of elevationally-extending strings of memory cells, comprising:
   a vertical stack of alternating insulative tiers and wordline tiers, the wordline tiers having terminal ends corresponding to control-gate regions of individual memory cells;
   a charge-blocking region of the individual memory cells extending elevationally along the individual control-gate regions;
   charge-storage material of the individual memory cells extending elevationally along individual of the charge-blocking regions;
   channel material extending elevationally along the stack, the channel material having a laterally-inner side;
   insulative charge-passage material laterally between the channel material and the charge-storage material;
   a first insulating material having first and second opposing sides, the first side being adjacent the laterally-inner side of the channel material, the first insulating material comprising a tube; and
   a second insulating material of different composition from that of the first insulating material and adjacent the second side of the first insulating material, the second insulating material comprising a tube radially inside of the first-insulating-material tube, the second insulating material having at least one of (a), (b), and (c), where,
      (a): lower oxygen diffusivity than the first material;
      (b): net positive charge;
      (c): at least two times greater shear strength than the first material.

2. The array of claim 1 wherein the first insulating material is directly against the laterally-inner side of the channel material.

3. The array of claim 1 wherein the second insulating material is directly against the second side of the first insulating material.

4. The array of claim 1 comprising a radially-central dielectric material radially inside of the second-insulating-material tube.

5. The array of claim 4 wherein the radially-central dielectric material comprises solid dielectric material.

6. The array of claim 5 wherein the solid dielectric material is a solid pillar.

7. The array of claim 5 wherein the radially-central dielectric material comprises void space.

8. The array of claim 4 wherein the radially-central dielectric material is devoid of solid material.

9. An array of elevationally-extending strings of memory cells, comprising:
   a vertical stack of alternating insulative tiers and wordline tiers, the wordline tiers having terminal ends corresponding to control-gate regions of individual memory cells;
   a charge-blocking region of the individual memory cells extending elevationally along the individual control-gate regions;
   charge-storage material of the individual memory cells extending elevationally along individual of the charge-blocking regions;
   channel material extending elevationally along the stack, the channel material having a laterally-inner side;
   insulative charge-passage material laterally between the channel material and the charge-storage material;
   a first insulating material having first and second opposing sides, the first side being adjacent the laterally-inner side of the channel material, the first insulating material comprising at least one of $Si_xO_y$ (x and y each greater than 0), $Si_xO_yN_z$ (x, y, and z each greater than 0), $Al_3O_4$, $ZrO_2$, $HfO_2$, $Pr_2O_3$, and $Ta_2O_5$; and
   a second insulating material of different composition from that of the first insulating material and adjacent the second side of the first insulating material, the second insulating material comprising at least one of $Al_2O_3$, HfN, $HfO_xN_y$ (x and y each greater than 0), $HfY_xO_y$ (x and y each greater than 0), BN, AlN, SiC, diamond, diamond-like carbon, $Si_xN_yH_z$ (x, y, and z each greater than 0), $Hf_xN_yH_z$ (x, y, and z each greater than 0), $HfO_xN_yH_z$ (x, y, and z each greater than 0), $HfY_xO_yH_z$ (x, y, and z each greater than 0), $BN_xH_y$ (x and y each greater than 0), and $AlN_xH_y$ (x and y each greater than 0).

10. The array of claim 9 wherein the first side of the first insulating material is directly against the laterally-inner side of the channel material and the at least one of $Si_xO_y$, $Si_xO_yN_z$, $Al_3O_4$, $ZrO_2$, $HfO_2$, $Pr_2O_3$, and $Ta_2O_5$ is directly against the laterally-inner side of the channel material.

11. The array of claim 9 wherein the second insulating material is directly against the second side of the first insulating material and the at least one of $Al_2O_3$, HfN, $HfO_xN_y$, $HfY_xO_y$, BN, AlN, SiC, diamond, diamond-like carbon, $Si_xN_yH_z$, $Hf_xN_yH_z$, $HfO_xN_yH_z$, $HfY_xO_yH_z$, $BN_xH_y$, and $AlN_xH_y$ is directly against the at least one of $Si_xO_y$, $Si_xO_yN_z$, $Al_3O_4$, $ZrO_2$, $HfO_2$, $Pr_2O_3$, and $Ta_2O_5$ of the first insulating material.

12. The array of claim 9 wherein the first insulating material comprises a tube and the second insulating material comprises a tube radially inside of the first-insulating-material tube.

13. The array of claim 12 comprising a radially-central dielectric material radially inside of the second-insulating-material tube.

14. The array of claim 13 wherein the radially-central dielectric material comprises solid dielectric material.

15. The array of claim 14 wherein the solid dielectric material is a solid pillar.

16. The array of claim 13 wherein the radially-central dielectric material comprises void space.

17. The array of claim 9 wherein the radially-central dielectric material is devoid of solid material.

18. The array of claim 9 wherein the second insulating material comprises $Al_2O_3$.

19. The array of claim 9 wherein the second insulating material comprises HfN.

20. The array of claim 9 wherein the second insulating material comprises $HfO_xN_y$.

21. The array of claim 9 wherein the second insulating material comprises $HfY_xO_y$.

22. The array of claim 9 wherein the second insulating material comprises BN.

23. The array of claim 9 wherein the second insulating material comprises AlN.

24. The array of claim 9 wherein the second insulating material comprises, SiC.

25. The array of claim 9 wherein the second insulating material comprises diamond.

26. The array of claim 9 wherein the second insulating material comprises diamond-like carbon.

27. The array of claim 9 wherein the second insulating material comprises $Si_xN_yH_z$.

28. The array of claim 9 wherein the second insulating material comprises $Hf_xN_yH_z$.

29. The array of claim 9 wherein the second insulating material comprises $HfO_xN_yH_z$.

30. The array of claim 9 wherein the second insulating material comprises $HfY_xO_yH_z$.

31. The array of claim 9 wherein the second insulating material comprises $BN_xH_y$.

32. The array of claim 9 wherein the second insulating material comprises $AlN_xH_y$.

* * * * *